United States Patent
Fukushima et al.

(10) Patent No.: US 8,728,255 B2
(45) Date of Patent: May 20, 2014

(54) POT-SHAPED COPPER SPUTTERING TARGET AND MANUFACTURING METHOD THEREOF

(75) Inventors: Atsushi Fukushima, Ibaraki (JP); Shiro Tsukamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1676 days.

(21) Appl. No.: 11/909,471

(22) PCT Filed: Feb. 8, 2006

(86) PCT No.: PCT/JP2006/302122
§ 371 (c)(1),
(2), (4) Date: Sep. 24, 2007

(87) PCT Pub. No.: WO2006/103833
PCT Pub. Date: Oct. 5, 2006

(65) Prior Publication Data
US 2009/0057139 A1     Mar. 5, 2009

(30) Foreign Application Priority Data
Mar. 28, 2005 (JP) ................... 2005-090609

(51) Int. Cl.
*C23C 14/34* (2006.01)
(52) U.S. Cl.
CPC .................... *C23C 14/34* (2013.01)
USPC ........................ 148/428; 148/538
(58) Field of Classification Search
CPC ....................................................... C23C 14/34
USPC ................... 148/538, 553, 554, 559; 428/561
See application file for complete search history.

(56) References Cited

U.S. PATENT DOCUMENTS

| 6,139,701 A | 10/2000 | Pavate et al. |
|---|---|---|
| 6,500,321 B1 | 12/2002 | Ashtiani et al. |
| 6,946,039 B1 * | 9/2005 | Segal et al. ............... 148/400 |
| 2004/0072009 A1 * | 4/2004 | Segal et al. ............... 428/561 |
| 2004/0144643 A1 | 7/2004 | Wu et al. |
| 2004/0245099 A1 | 12/2004 | Hukushima |
| 2007/0108046 A1 | 5/2007 | Tsukamoto |

OTHER PUBLICATIONS

ESP@CENET Database, English Abstract of JP 11-158614, Jun. 15, 1999.

* cited by examiner

*Primary Examiner* — Jie Yang
(74) *Attorney, Agent, or Firm* — Howson & Howson LLP

(57) ABSTRACT

Provided is a pot-shaped copper sputtering target manufactured with die forging, wherein the Vickers hardness Hv at all locations of the inner surface of the pot-shaped target is 70 or greater. With this pot-shaped copper sputtering target, the average crystal grain size in the target structure is 65 μm or less. Further, the inner surface of the pot-shaped target comprises crystalline orientations of (220), (111), (200), (311) obtained by X-ray diffraction, and the crystalline orientation of the face subject to erosion of the pot-shaped target is of a (220) primary orientation. An object of the present invention is to obtain a manufacturing method of a high quality sputtering target by improving and devising the forging process and heat treatment process to make the crystal grain size refined and uniform, and to obtain a high-quality sputtering target.

15 Claims, 1 Drawing Sheet

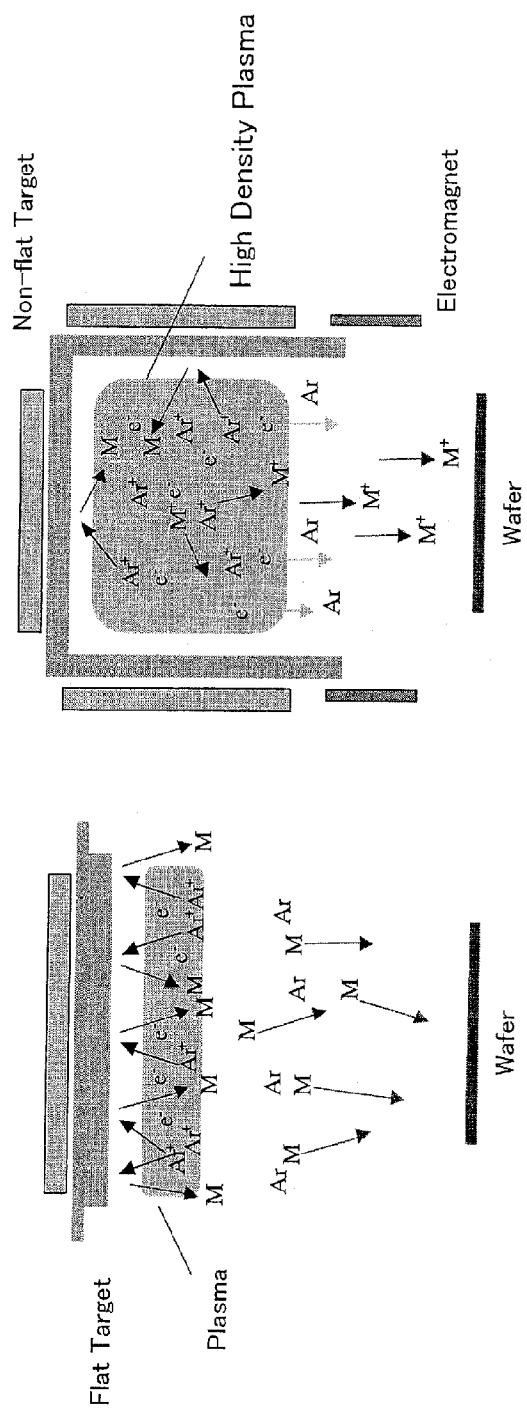
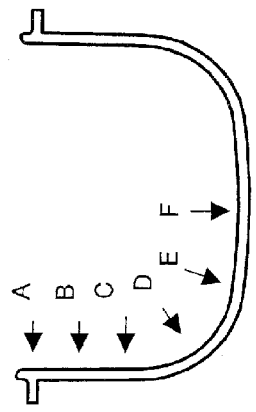
Fig. 1a
Fig. 1b
Fig. 2 Cross Section

POT-SHAPED COPPER SPUTTERING TARGET AND MANUFACTURING METHOD THEREOF

BACKGROUND OF THE INVENTION

The present invention relates to a copper sputtering target formed into a pot shape by die forging, and a manufacturing method thereof.

In recent years, the sputtering method for forming a film from materials such as metal or ceramics has been used in numerous fields such as electronics, corrosion resistant materials and ornaments, catalysts, as well as in the manufacture of cutting/grinding materials and abrasion resistant materials.

Although the sputtering method itself is a well-known method in the foregoing fields, recently, particularly in the field of electronics, a sputtering target suitable for forming films of complex shapes and forming circuits is in demand. For instance, a copper target (HCM target) having a pot-shaped, three-dimensional structure is being used.

FIG. 1a illustrates a conventional target, and FIG. 1b illustrates a copper target having a pot-shaped, three-dimensional structure. When using a pot-shaped target, ionization sputtering is employed, and this is characterized in that dense plasma is formed.

A standard planar target is deposited by colliding Ar ions against a target and beating out metal atoms. Contrarily, with ionization sputtering, although the process is the same as a planar target up to colliding Ar ions against a target and beating out metal atoms, the metal atoms are ionized with dense plasma, whereby directivity can be given to the ionized metal atoms. Thus, metal atoms can be filled into deep grooves such as holes.

Generally, a copper target comprising this kind of three-dimensional structure is manufactured by subjecting an ingot or a billet obtained by melting and casting metal to hot forging, annealing, and die forging. Hot forging of the ingot or the billet will destroy the cast structure, diffuse and eliminate air holes and segregation, and, through recrystallization annealing, it is possible to increase the density and strength of the structure to a certain degree.

Subsequently, the material subject to forging and recrystallization annealing is further subject to die forging to obtain a copper target shape of a prescribed three-dimensional structure, recrystallization annealing and stress-relieving annealing are performed after die forging, and surface treatment is ultimately performed to obtain a copper target.

Although this kind of copper target manufacturing method will not cause any problem in the manufacture of a standard planar target, several problems will arise when manufacturing a copper target having the foregoing pot-shaped, three-dimensional structure.

Since there will be locations that will be severely affected and locations that will hardly be affected by the plastic deformation during the die forging to be performed in the manufacture of the target, there are cases where the subsequent structure will differ. For example, locations facing the forging direction will merely be subject to compressive force, while locations along the forging direction; that is, the internal surface of the pot-shaped structure will be subject to strong processing like ironing.

Like this, with locations strongly affected and weakly affected by plastic deformation, the crystal orientation and hardness will differ significantly since the size of the recrystallized grains during annealing before die forging will have a significant influence. In other words, crystals will become refined at locations strongly affected by plastic deformation, and crystals will become coarsened at locations weakly affected by plastic deformation. Further, at the boundary area of such locations strongly affected and weakly affected by plastic deformation, these will be of an irregularly mixed status or gradually changing status in the crystal structure.

In particular, a pot-shaped target requires that the inner face structure is uniform and must have sufficient strength so as to maintain such shape, but this strength could not be obtained conventionally. Thus, as a result of the creep phenomenon, there is a problem in that the flange portion will deform considerably.

Generally speaking, when performing sputtering, finer the target crystals, more uniform the deposition, and it is possible to obtain a film with few generation of arcing and particles, and which is uniform and stable. Therefore, the coarsening of crystal grains and the existences of irregular crystal grains arising during the die forging and subsequent annealing will be problematic in that it will increase the generation of arcing and particles, and deteriorate the quality of the sputter deposition.

Further, a significant variation in the crystalline orientation or difference in the hardness at the respective portions of the target will largely affect the sputter rate, and there is a problem in that the quality of the target will deteriorate.

Accordingly, a copper sputtering target having a pot-shaped structure manufactured by die forging entailed problems of deteriorating the quality of the film resulting from the difference in the hardness of the portions of the target, difference in the crystal orientation, and coarsening and unevenness of crystal grains.

SUMMARY OF THE INVENTION

The present invention was devised in order to overcome the foregoing problems. Thus, an object of the present invention is to provide a high-quality sputtering target having a uniform hardness in the respective parts of the target and sufficient strength so that no deformation will occur in the flange portion of a pot-shaped target by improving and devising the forging process and heat treatment process, whereby it will be possible to reduce variation in the crystal orientation, refine and uniformize the crystal grain size, and reduce the generation of nodules and particles during sputtering.

In light of the above, the present invention provides:
1. A pot-shaped copper sputtering target manufactured with die forging, wherein the Vickers hardness Hv at all locations of the inner surface of the pot-shaped target is 70 or greater;
2. The pot-shaped copper sputtering target according to paragraph 1 above, wherein the hardness difference of the lowest portion in comparison to the highest portion of the hardness Hv is within ±30%;
3. The pot-shaped copper sputtering target according to paragraph 1 or paragraph 2 above, wherein the average crystal grain size in the target structure is 65 µm or less;
4. The pot-shaped copper sputtering target according to any one of paragraphs 1 to 3 above, wherein the ratio of the maximum average crystal grain size to the minimum average crystal grain size is <2.0;
5. The pot-shaped copper sputtering target according to any one of paragraphs 1 to 4 above, wherein the inner surface of the pot-shaped target comprises crystalline orientations of (220), (111), (200), (311) obtained by X-ray diffraction, and the crystalline orientation of the face subject to erosion of the pot-shaped target is of a (220) primary orientation;
6. The pot-shaped copper sputtering target according to any one of paragraphs 1 to 5 above, wherein the inner surface of the pot-shaped target comprises crystalline orientations of (220), (111), (200), (311) obtained by X-ray diffraction, and the orientation ratio of the (220) crystalline orientation of the face subject to erosion of the pot-shaped target is 0.45% or greater.

The target of the present invention yields a superior effect of having a uniform hardness in the respective parts of the target and sufficient strength, making crystal grain size refined and uniform, by reducing variation in the crystal orientation, inhibiting the deformation of the target, and obtaining a superior sputtering target with few generation of nodules and particles during sputtering. Further, since it will be possible to prevent unnecessary sputtering of the target, an additional effect is yielded in that the target life can be improved.

BRIEF DESCRIPTION OF THE DRAWINGS

FIG. 1a and FIG. 1b are schematic diagrams explaining the sputtering status of a planar target and a pot-shaped target; and FIG. 2 is a cross section of the pot-shaped copper target after die forging.

DETAILED DESCRIPTION OF THE INVENTION

The sputtering target of the present invention is manufactured according to the following process. To illustrate a specific example, foremost, copper is melted and cast to prepare an ingot or a billet. Subsequently, this ingot or billet is subject to hot forging at 700 to 900° C., and thereafter subject to preforming at room temperature and a processing ratio of 50% or greater. As a result of the foregoing forging, the cast structure will be destroyed, and air holes and segregation can be diffused or eliminated.

This is further subject to recrystallization annealing at a temperature of 100 to 200° C. to adjust the crystal grains. The material subject to recrystallization annealing is further subject to die forging at a temperature of 100 to 200° C. into a pot shape so as to obtain a pot-shaped copper sputtering target.

The foregoing hot forging is desirably performed by way of kneading, and the repetition of hot forging is effective in improving the characteristics. Incidentally, the appropriate recrystallization temperature is decided upon giving consideration to the amount of stress, temperature and time. When performing hot kneading, it is desirable that the total absolute value of true strain is 4 or greater.

Preforming is performed at room temperature. Here, although the degree of processing will differ depending on the ultimately demanded crystal grain size, it is preferably 20% or greater. In particular, processing is desirably performed at a processing ratio of 50 to 90%. Thereby, strong processing strain will be yielded in the material. Like this, the reason for performing cold preforming is to introduce a greater processing strain, and to maintain the temperature of the material during the preforming process to be as constant as possible. As a result, the introduced strain can be made sufficiently large and uniform.

After performing cold preforming, recrystallization annealing is further performed to adjust the crystal grains. The recrystallization annealing after cold preforming is performed at a relatively low temperature of 100 to 200° C. Even with low-temperature annealing, since sufficient strain is yielded due to preforming, recrystallization is thereby enabled. It is thereby possible to make the average crystal grain size 65 μm or less.

Further, the average crystal grain size $D_0$ of the largest portion of the average crystal grain size and the average crystal grain size $d_0$ of the smallest portion of the average crystal grain size can be $D_0/d_0 < 2.0$. Like this, even when involving a demanding process of forming a pot shape, it is possible to refine the average crystal grain size of the respective portions of the pot-shaped target, and the minimal change in the crystal grain size is a result of the special manufacturing method of the present invention.

The foregoing cold preforming is an important process of the present invention, and this process will enable the acquisition of a target having fine and uniform crystals in the final process.

Subsequently, the cold preforming material having such fine and uniform crystals is subject to die forging. Incidentally, this die forging includes the spinning process. In other words, all die forging processes described herein include the spinning process. Further, after die forging, crystal homogenization annealing or stress-relieving annealing may be performed.

In die forging, as described above, there will be locations that will be severely affected and locations that will hardly be affected by strain. Since the crystal grains will have been refined in the front-end cold preforming at locations that will hardly be affected by strain, there will hardly be any difference in the crystal grain size with the other locations that will be strongly affected by the strain.

Thereby, the crystal homogenization annealing or stress-relieving annealing after die forging will eliminate the stress generated internally, and a target having a roughly uniform crystal grain size overall can be obtained. Thereby, it is possible to obtain a pot-shaped copper sputtering target where the average crystal grain size D of the largest portion of the average crystal grain size and the average crystal grain size d of the smallest portion of the average crystal grain size is $D/d < 2.0$.

As a result of the foregoing process, the Vickers hardness Hv at all locations of the inner surface of the pot-shaped target can be made to be 70 or greater. This is a significant characteristic of the present invention. If the conditions of a uniform pot-shaped copper target having a high hardness can be achieved, it is possible to obtain a target with superior sputter characteristics such as no deformation in the flange portion, and generation of few nodules and particles during sputtering. Like this, although the flange portion of the pot-shaped copper target will not become an eroded portion during sputtering, since it will have a high hardness as with the other portions, it will not deform.

Therefore, it should be understood that a pot-shaped copper sputtering target, wherein the Vickers hardness Hv at all locations of the inner surface of the pot-shaped target is 70 or greater, is the primary configuration of the present invention. In particular, it is desirable that the average Vickers hardness Hv is 80 or greater.

Further, the hardness difference of the lowest portion in comparison to the highest portion of the hardness Hv can be made to be within ±30%. This is also a significant characteristic of the present invention, wherein a more favorable target can be obtained.

The inner surface of the pot-shaped target may comprise crystalline orientations of (220), (111), (200), (311) obtained by X-ray diffraction, and the crystalline orientation of the face subject to erosion of the pot-shaped target may be of a (220) primary orientation. In particular, it is desirable that the orientation ratio of the crystalline orientation (220) is 45% or greater. Incidentally, as described above, the primary objective of the present invention is to achieve the hardness of the inner face of the target.

Although the crystalline orientation of the face to be subject to the erosion of the pot-shaped target is a (220) primary orientation in the present invention, the face to be subject to the erosion of the pot-shaped target is not the entire inner face. In other words, the flange portion and bottom center portion of the pot-shaped target will not be subject to erosion. Rather, the sputtered particles will adhere (deposit) to these areas. This is a phenomenon unique to a pot-shaped target.

It should be easily understood that it is not necessary to make the crystalline orientation of these portions a (220) primary orientation. In other words, even if these portions are of a (220) primary orientation, the other crystals may have orientation, and this will not cause any particular problem.

Incidentally, the flange portion and bottom center portion that will not be subject to erosion are portions A and F in FIG. 2 as described later, and these are respectively in the range of 15% (A portion) and 8% (F portion) of the overall area of the inner face of the target.

As described above, a unique sputtering phenomenon can be seen at the erosion portion of the inner face of the pot-shaped target where (220) is the primary orientation. This is explained below.

With an HCM target, the side face of the target is usually sputtered, and the sputtered atoms are ionized by dense plasma and fall on the wafer. Nevertheless, not all atoms are ionized as described above, and the sputtered atoms fly in all directions, and even get deposited on the bottom face of the target. Therefore, in order to increase the ionization rate of atoms, it is desirable to reduce the number of sputtered atoms.

Normally, the eroded surface of the target to be used in sputtering is devised to improve the sputter rate, and when making the foregoing (220) a primary orientation, this will result in an entirely opposite function to a normal target. In other words, in comparison to a (111) orientation with a greater sputter rate, the (220) primary orientation is characterized in that the sputter rate becomes smaller.

This is a rather preferable phenomenon, and it is possible to reduce the number of sputtered atoms, and improve the ionization rate of atoms. Therefore, it is possible to relatively increase the number of ions that will fall on the wafer. Like this, since it is possible to prevent the unnecessary sputtering of the target, and an effect is yielded in that the target life can be improved.

Accordingly, the fact that the (220) crystalline orientation accounts for much of the erosion face inside the pot-shaped target is extremely desirable also from this respect. In particular, it is desirable that the orientation ratio of the crystalline orientation (220) is 45% or greater, particularly 50% or greater at average.

As described above, since the flange portion and the bottom portion of the pot-shaped target will not be subject to erosion, the orientation ratio of the crystalline orientation (220) can be completely ignored.

EXAMPLES

The Examples are now explained. Incidentally, these Examples merely illustrate an example of the present invention, and do not limit the present invention in any way. In other words, this invention covers other modes and modifications contained in the technical spirit of the present invention. In addition, the following Comparative Examples illustrate conventional manufacturing methods.

A copper (6N) material was melted and cast to prepare an ingot. Subsequently, this ingot was subject to hot kneading at 800° C. As a result of this hot kneading, it was possible to destroy the cast structure, diffuse and eliminate air holes and segregation, and obtain a forging with a uniform structure.

Subsequently, the hot kneading material was used in the preforming at a room temperature and a processing ratio of 90%. After performing this preforming, recrystallization annealing was performed at 150° C. for 2 hours in order to adjust the crystal grains. Thereby, the crystal grains were adjusted to be fine and uniform where the average crystal grain size was 65 μm or less.

The obtained preforming material having such fine and uniform crystals was subject to die forging to obtain a pot-shaped target. Die forging was performed at 100° C.

FIG. 2 is a cross section of the pot-shaped target created with the foregoing process. FIG. 2 shows a flange portion A, sides B, C, a joint D, and pot bottoms E, F (center). Incidentally, as described above, among the portions of FIG. 2, the flange portion A and the bottom portion F will not be subject to erosion during sputtering. The standardization of the strength of the crystalline orientation obtained by X-ray diffraction (XRD) (value obtained by dividing the XRD peak strength with the relative intensity of JCPDS (card number 40836) is shown in Table 1.

TABLE 1

X-Ray Diffraction Result (Value obtained by dividing the XRD peak strength by relative intensity of JCPDS)

| | JCPDS | Relative Intensity | (111) 100 | (200) 46 | (220) 20 | (311) 17 | Total | Orientation Ratio of (220) |
|---|---|---|---|---|---|---|---|---|
| Comparative Examples | B | | 129 | 61 | 213 | 96 | 498.2 | 0.43 |
| | C | | 78 | 61 | 141 | 49 | 328.6 | 0.43 |
| | D | | 137 | 61 | 125 | 102 | 425.1 | 0.29 |
| | E | | 95 | 102 | 159 | 209 | 565.1 | 0.28 |
| Examples | B | | 54 | 96 | 294 | 162 | 607.0 | 0.48 |
| | C | | 99 | 87 | 363 | 185 | 732.5 | 0.50 |
| | D | | 61 | 61 | 347 | 93 | 562.7 | 0.62 |
| | E | | 51 | 64 | 354 | 77 | 545.5 | 0.65 |

As shown in Table 1, this target comprises the crystalline orientations of (220), (111), (200), (311) obtained by X-ray diffraction. Sections B to E to become the eroded portions were all a (220) primary orientation. In addition, it is evident that the orientation ratio of (220) among the crystalline orientations is 45% or greater.

The average grain size is shown in Table 2. The average grain sizes are respectively A: 64 μm, B: 63 μm, C: 61 μm, D: 76 μm, E: 50 μm, and F: 42 μm, and the relationship of the average crystal grain size D of the largest portion of the average crystal grain size and the average crystal grain size d of the smallest portion of the average crystal grain size was D/d=1.8. Like this, it was possible to prepare a target with a relatively uniform and fine structure without any coarse grains or extremely fine grains.

In die forging, as described above, there will be locations that will be severely affected and locations that will hardly be affected by strain. Nevertheless, since the crystal grains will have been refined in the front-end cold preforming and recrystallization annealing, so as long as the method of the present invention is performed, there will not be any significant grain growth, and there will hardly be any difference in the crystal grain size with the other locations that will be strongly affected by the strain.

TABLE 2

| | Crystal Grain Size (μm) | |
|---|---|---|
| | Comparative Examples | Examples |
| A | 88 | 64 |
| B | 91 | 63 |
| C | 88 | 61 |
| D | 96 | 76 |
| E | 86 | 50 |
| F | 88 | 42 |

The measurement result of the Vickers hardness (Hv) of the pot-shaped target created with the foregoing process is shown in Table 3. Although the effect can be attained with Hv70 or greater, as shown in Table 3, the results were respectively A: 93, B: 101, C: 82, D: 80, E: 97, and F: 102, and the hardness at all locations exceeded Hv80, and it is evident that the all locations had even higher strength.

Further, the hardness difference of the lowest portion in comparison to the highest portion of the hardness Hv was within ±30%, and it was possible to confirm that a homogenous hardness was obtained. This is a result of adjusting the crystal grains to be fine in the cold preforming and low-temperature recrystallization annealing, and this is a significant characteristic of the present invention. Incidentally, as described above, the flange portion A in the pot-shaped target also achieved a high hardness of Hv93. This high hardness of the flange portion A was even more favorable in preventing deformation.

Further, as a result of making the (220) orientation a primary orientation, it was possible to reduce the number of sputtered atoms, increase the ionization rate of atoms, and relatively increase the number of ions that fall on the wafer. Since this enables the prevention of unnecessary sputtering of the target, an additional effect is yielded in that it is possible to improve the target life in comparison to the (111) orientation with a high sputter rate.

TABLE 3

| | Vickers Hardness (Hv) | |
|---|---|---|
| Pos. | Comparative Examples | Examples |
| A | 46 | 93 |
| B | 47 | 101 |
| C | 45 | 82 |
| D | 44 | 80 |
| E | 47 | 97 |
| F | 47 | 102 |

COMPARATIVE EXAMPLES

As with the Examples, a copper (6N) ingot was prepared. This ingot was subject to cold forging, then subject to cold preforming at a processing ratio of 50%, and further subject to recrystallization annealing at 300° C. for 2 hours. The obtained preforming material was subject to die forging to obtain a pot-shaped target at 400° C. After die forging, crystal homogenization and stress-relieving annealing were performed at 425° C.

As with the Examples, standardization of the strength of the crystalline orientation obtained by X-ray diffraction (XRD) (value obtained by dividing the XRD peak strength with the relative intensity of JCPDS (card number 40836) is shown in Table 1.

As shown in Table 1, although this target comprises the crystalline orientations of (220), (111), (200), (311) obtained by X-ray diffraction, the (220) in the crystalline orientation is not necessarily a primary orientation, and the primary orientation is (111) at portion (D), which is an eroded portion, and the primary orientation is (311) at portion (E). Like this, the primary orientation varies by location, and did not satisfy the conditions of the present invention; that is, the conditions of the (220) primary orientation.

As with the Examples, the pot bottoms E, F, the flange portion A, and the sides B, C, D shown in FIG. 2 are all on the target side (side to be subject to erosion upon sputtering), and the average grain size of portions A, B, C, D, E, F on the inside of the target is shown in Table 2. The average grain sizes were respectively A: 88 μm, B: 91 μm, C: 88 μm, D: 96 μm, E: 86 μm, and F: 88 μm, and the crystal grain size exceeded 85 μm and coarsened.

Further, the measurement result of the Vickers hardness (Hv) of the pot-shaped target created with the foregoing process of the Comparative Examples is shown in Table 3. As shown in Table 3, the results were respectively A: 46, B: 47, C: 45, D: 44, E: 47, and F: 47, and the hardness at all locations fell below Hv50, and the hardness was insufficient. Like this, the coarsening of the average grain size and deterioration in the hardness are considered to be caused by the die forging temperature and the annealing temperature after die forging being too high.

Further, as described above, the hardness of the flange portion A was Hv46, and the hardness was insufficient, the structure was uneven, the strength was insufficient, and the target flange portion deformed.

Further, since the (111) orientation ratio with a high sputter rate accounted for most of the locations, the number of sputtered atoms increased, the ionization rate of atoms decreased, and the number of ions that fell on the wafer relatively decreased. This resulted in the unnecessary sputtering of the target increasing, and deterioration in the target life in comparison to the Examples.

The present invention yields a superior effect of having a uniform hardness in the respective parts of the target and sufficient strength so that no deformation will occur in the flange portion of a pot-shaped target by improving and devising the forging process and heat treatment process. Thereby, since it will be possible to inhibit the deformation of the target and reduce the generation of nodules and particles during sputtering, the present invention is useful as a copper target material for ionization sputtering.

The invention claimed is:

1. A pot-shaped copper sputtering target manufactured with die forging, wherein Vickers hardness Hv at any location of the inner surface of the pot-shaped target is 70 or greater, wherein crystalline texture in the inner surface of the pot-shaped target comprises crystalline orientations of (220), (111), (200), (311) as measured by X-ray diffraction, and wherein a ratio of normalized XRD peak strengths of the (220) reflection to total of normalized XRD peak strengths of the (220), (111), (200) and (311) reflections in the face of the inner surface that is subject to sputtering erosion in the pot-shaped target during sputtering is 45% or greater.

2. The pot-shaped copper sputtering target according to claim 1, wherein difference in the Vickers hardness Hv between a location of the inner surface having the lowest hardness and a location of the inner surface having the highest hardness Hv is within ±30% in comparison to the highest hardness.

3. The pot-shaped copper sputtering target according to claim 2, wherein the average crystal grain size in the target structure is 65 μm or less.

4. The pot-shaped copper sputtering target according to claim 3, wherein a ratio of average crystal grain size of a location of the inner surface at which the average crystal grain size is greatest to a location of the inner surface at which the average crystal grain size is smallest is less than 2.0.

5. The pot-shaped copper sputtering target according to claim 4, wherein the crystalline texture in the face of the inner surface that is subject to sputtering erosion in the pot-shaped target during sputtering is of (220) as a primary orientation thereof.

6. The pot-shaped copper sputtering target according to claim 1, wherein the average crystal grain size in the target structure is 65 μm or less.

7. The pot-shaped copper sputtering target according to claim 6, wherein a ratio of average crystal grain size of a location of the inner surface at which the average crystal grain size is greatest to a location of the inner surface at which the average crystal grain size is smallest is less than 2.0.

8. The pot-shaped copper sputtering target according to claim 7, wherein the crystalline texture in the face of the inner surface that is subject to sputtering erosion in the pot-shaped target during sputtering is of (220) as a primary orientation thereof.

9. The pot-shaped copper sputtering target according to claim 1, wherein a ratio of average crystal grain size of a location of the inner surface at which the average crystal grain size is greatest to a location of the inner surface at which the average crystal grain size is smallest is less than 2.0.

10. The pot-shaped copper sputtering target according to claim 9, wherein the crystalline texture in the face of the inner surface that is subject to sputtering erosion in the pot-shaped target during sputtering is of (220) as a primary orientation thereof.

11. The pot-shaped copper sputtering target according to claim 1, wherein the crystalline texture in the face of the inner surface that is subject to sputtering erosion in the pot-shaped target during sputtering is of (220) as a primary orientation thereof.

12. A pot-shaped sputtering target consisting of copper and having an inner surface with Vickers hardness Hv at all locations thereof of 80 or greater, said pot-shaped sputtering target having a structure having been subject to die forging to form its pot-shape said inner surface having a crystalline texture comprising crystalline orientations of (220), (111), (200), (311) as measured by X-ray diffraction, and a ratio of normalized XRD peak strengths of the (220) reflection to total of normalized XRD peak strengths of the (220), (111), (200) and (311) reflections in a face of the inner surface that is subject to sputtering erosion during sputtering being 45% or greater.

13. The pot-shaped sputtering target according to claim 12, wherein a primary orientation of the crystalline texture in the face of the inner surface that is subject to sputtering erosion is (220).

14. The pot-shaped copper sputtering target according to claim 12, wherein a Vickers hardness Hv between a location of the inner surface having a lowest hardness is within 30% of a location of the inner surface having a highest hardness.

15. The pot-shaped copper sputtering target according to claim 14, wherein the average crystal grain size in the target is 65 μm or less, and wherein a ratio of an average crystal grain size of a location of the inner surface at which the average crystal grain size is greatest to a location of the inner surface at which the average crystal grain size is smallest is less than 2.0.

\* \* \* \* \*